United States Patent
Dray et al.

(10) Patent No.: US 11,443,804 B2
(45) Date of Patent: Sep. 13, 2022

(54) SENSING TECHNIQUES FOR RESISTIVE MEMORY

(71) Applicant: Arm Limited, Cambridge (GB)

(72) Inventors: Cyrille Nicolas Dray, Antibes (FR); El Mehdi Boujamaa, Valbonne (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/122,031

(22) Filed: Dec. 15, 2020

(65) Prior Publication Data

US 2022/0189547 A1    Jun. 16, 2022

(51) Int. Cl.
*G11C 11/00* (2006.01)
*G11C 13/00* (2006.01)
*G11C 11/16* (2006.01)

(52) U.S. Cl.
CPC ........ *G11C 13/004* (2013.01); *G11C 11/1673* (2013.01)

(58) Field of Classification Search
CPC ........................... G11C 13/004; G11C 11/1673
USPC ......................................................... 365/148
See application file for complete search history.

(56) References Cited

U.S. PATENT DOCUMENTS

| | | | | |
|---|---|---|---|---|
| 10,622,066 B2* | 4/2020 | Antonyan | ............... | G11C 7/067 |
| 10,854,289 B2* | 12/2020 | Antonyan | ............ | G11C 29/021 |
| 2005/0122816 A1* | 6/2005 | Moriyama | .......... | G11C 11/1673 365/222 |

* cited by examiner

*Primary Examiner* — Tha-O H Bui
(74) *Attorney, Agent, or Firm* — Pramudji Law Group PLLC; Ari Pramudji (57) ABSTRACT

Various implementations described herein are related to a device having a sense amplifier that provides output data based on sensing a difference between input signals. The device may have a tracking circuit that tracks a resistive state of a bitcell and provides an input signal to the sense amplifier based on the tracked resistive state of the bitcell. The device may have a bitcell circuit that senses a data value associated with the resistive state of the bitcell and provides another input signal to the sense amplifier based on the sensed data value of the bitcell.

18 Claims, 5 Drawing Sheets

410 — fabricate an array of sense amplifiers that provides multi-bit output data signals based on sensing a difference between multiple input signals 420 — fabricate tracking circuitry for the sense amplifiers that tracks resistive states of bitcells and provides first input signals to the sense amplifiers based on the tracked resistive states of the bitcells 430 — fabricate memory circuitry for the sense amplifiers that senses stored data values associated with the resistive states of the bitcells and provides second input signals to the sense amplifiers based on the sensed data values of the bitcells

FIG. 4

SENSING TECHNIQUES FOR RESISTIVE MEMORY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern circuit designs, conventional resistive memory devices are typically deficient in functional and/or operational applications. For instance, conventional resistive memory devices suffer from limited read margins during read operations. As such, there exists a need for redesigning resistive memory devices to include advanced sensing and referencing techniques for reading resistive memory cells due so as to thereby improve read margins when compared to other resistive memory technologies.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to sensing schemes and techniques for resistive memory applications in physical circuit layout designs. Also, the various schemes and techniques described herein may provide various sensing circuitry for sensing resistive states of magneto-resistive cells having a magnetic tunneling junction (MTJ) structure so as to improve data sensing area, efficiency and endurance. Also, the various schemes and techniques described herein provide for global trimming of resistor arrays that may be used to combine reference resistors and sense amplifiers for resistive memory applications. In various implementations, a lower standby power reference circuit may be provided for resistive read operations, such as, e.g., magneto-resistive random access memory (MRAM) operations. In these instances, MRAM read operations may use a reference mid-point resistor positioned between bit resistance populations of logic lows (0s) and logic highs (1s), which may refer to a key feature when building reliable and high-yielding MRAM. In some instances, this reference resistor (Rref) may exhibit a negative temperature coefficient that allows for tracking read margins temperature sensitivity.

The memory architecture may refer to various volatile memory and non-volatile memory, such as, e.g., static random access memory (SRAM) and/or magneto-resistive random access memory (MRAM). The memory architecture may include memory circuitry having a core array of memory cells or bitcells that are accessible via data access lines, such as one or more wordlines and bitlines. In SRAM applications, data access lines refer to complementary bit-lines (BL, NBL), and in MRAM applications, data access lines refer to at least one bitline (BL) and at least one source line (SL).

Various implementations of resistive memory sensing schemes and techniques for memory applications will be described herein with reference to FIGS. 1-4.

Figure 1:
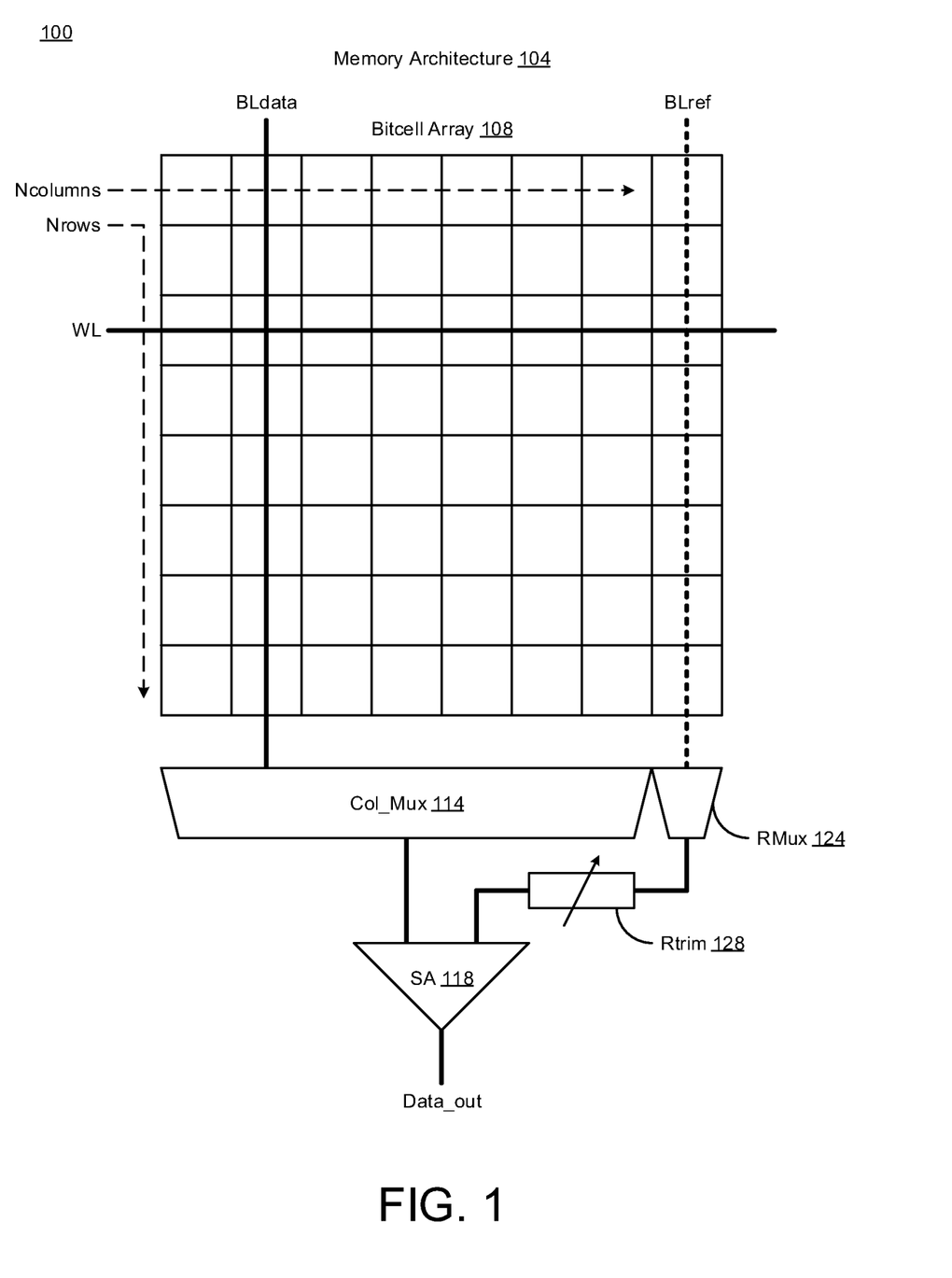
FIG. 1 illustrates a schematic diagram of memory architecture in accordance with various implementations described herein.

FIG. 1 illustrates a diagram 100 of memory architecture 104 in accordance with various implementations described herein.

In various implementations, the memory architecture 104 may be implemented as a system or device having various integrated circuit (IC) components that are arranged and coupled together as an assemblage or combination of parts that provide for physical circuit designs and various related structures. In some instances, a method of designing, building, and fabricating the memory architecture 104 as an integrated system or device may involve use of the various IC components described herein so as to implement sensing schemes and techniques associated therewith. Further, the memory architecture 104 may be integrated with computing circuitry and related components on a single chip, and the memory architecture 104 may be implemented in various embedded systems for automotive, electronic, mobile, server and Internet-of-things (IoT) applications.

As shown in FIG. 1, the memory architecture 104 has various components including, e.g., core bitcell array circuitry 108, column multiplexer circuitry 114, and sense amplifier circuitry 118. In some instances, the core bitcell array circuitry 108 may have an array of memory cells (or bitcells) that are accessible via one or more wordlines (WL) and one or more bitlines (BLdata). Also, the column multiplexer circuitry (Col_Mux) 114 may be coupled between the core bitcell array circuitry 108 and sense amplifier (SA) circuitry 118, wherein the column multiplexer circuitry (Col_Mux) 114 is coupled to the core bitcell array circuitry 108 with the one or more bitlines (BLdata), and also, an output of the column multiplexer circuitry (Col_Mux) 114 is coupled to the sense amplifier circuitry 118. Further, the sense amplifier circuitry 118 may receive selected data from the column multiplexer circuitry (Col_Mux) 114 and provide output data (Data_out) based on a trimmed resistor (Rtrim). Also, additional description related to the memory architecture 104 and various components associated therewith, such as, e.g., the sense amplifier (SA) circuitry 118, are described in greater detail herein below in FIGS. 2A-2B and 3A-3B.

In some implementations, the memory architecture 104 may have a reference bitline (BLref), a bitline reference multiplexer (RMux) 124 and a trimming resistor (Rtrim) 128, such as, e.g., one or more variable resistors. The RMux 124 and the Rtrim 128 may be coupled in series between the core bitcell array circuitry 108 and the sense amplifier (SA) circuitry 118. Also, the Rmux 124 is a multiplexer that selects at least one reference bitline (BLref) from the core bitcell array circuitry 108. The RMux 124 may receive a bitline reference signal (BLref) from the core bitcell array circuitry 108 and then provide an RMux output signal to the Rtrim 128, and also, the Rtrim 128 may receive the output signal from the RMux 124 and provide an Rtrim output signal to the sense amplifier (SA) circuitry 118. Also, in this instance, the sense amplifier (SA) circuitry 118 may receive output signals from the column multiplexer circuitry (Col_Mux) 114 and the Rtrim 128 as input signals, and then the sense amplifier (SA) circuitry 118 may provide the output data (Data_out) based on the received input signals. As shown in FIG. 1, the sense amplifier (SA) 118 and the reference resistor Rtrim 128 may be coupled to the array of bitcells 108 through the column multiplexer (Col_Mux) 114 and/or the RMux 124, which may be incorporated as part of the Col_Mux 114.

The memory architecture 104 may be implemented as an integrated circuit (IC) in using various types of memory, such as, e.g., random access memory (RAM), including static RAM (SRAM), magneto-resistive RAM (MRAM), and/or any other type of similar memory. The memory architecture 104 may be implemented as an integrated circuit (IC) with dual rail memory architecture and any related circuitry. The memory architecture 104 may be integrated with computing circuitry and related components on a single chip. Also, the memory architecture 104 may be implemented in embedded systems for electronic, mobile and Internet-of-things (IoT) applications, including low power sensor nodes.

As shown in FIG. 1, the memory architecture 104 may have the core bitcell array circuitry 108 that has an array of memory cells, wherein each memory cell may be referred to as a bitcell. Also, each memory cell (or bitcell) may be configured to store at least one data bit value (e.g., a data value related to a logical '0' or '1'). The array of memory cells may include any number (N) of memory cells (or bitcells) arranged in various applicable configurations, such as, e.g., a two-dimensional (2D) memory array having any number of columns (Ncolumns) and any number of rows (Nrows) with memory cells arranged in a 2D grid pattern with associated indexing capabilities.

In various implementations, the memory architecture 104 may include volatile or non-volatile memory bitcell structures, such as, e.g., static random access memory (SRAM) bitcell structures or a magneto-resistive random access memory (MRAM) bitcell structures. In some instances, the bitcell structures may be configured with 1T1R MRAM bitcells having one transistor component (1T) and one resistor component (1R). In some instances, the transistor (T) may refer to an N-type MOS (NMOS) transistor, and also, the resistor (R) may refer to a magnetic based resistor having a magnetic tunneling junction (MTJ) interposed between a pinned layer (PL) and a free layer (FL). In reference to MTJ MRAM bitcells, data is stored with magnetic storage elements that are formed from two ferromagnetic plates (PL, FL) separated by a thin insulating layer (MTJ). The pinned layer (PL) may refer to a permanently magnetized plate having a set polarity, and the free layer (FL) may refer to a selectively magnetized plate having a selectively changeable polarity that matches or is opposite to the polarity of the pinned layer (PL). Also, when sensing for resistance, the aligned polarities may provide lower resistance for representing a first readable logical data state, and the opposing polarities may provide higher resistance for a second readable logical data state. As such, a logical zero (0) or a logical one (1) may be stored in the MTJ MRAM bitcell, e.g., based on a sensed resistance level through the MTJ MRAM bitcell. Moreover, for data access, each bitcell may include a wordline (WL), and in MRAM, the bitlines may be implemented with a bitline (BL) and a source line (SL). However, even though MTJ-MRAM bitcell structures may be used in the core bitcell array circuitry 108, any other type of bitcell (e.g., SRAM) may be used to achieve similar results of the sensing schemes and techniques disclosed herein.

Figure 2A:
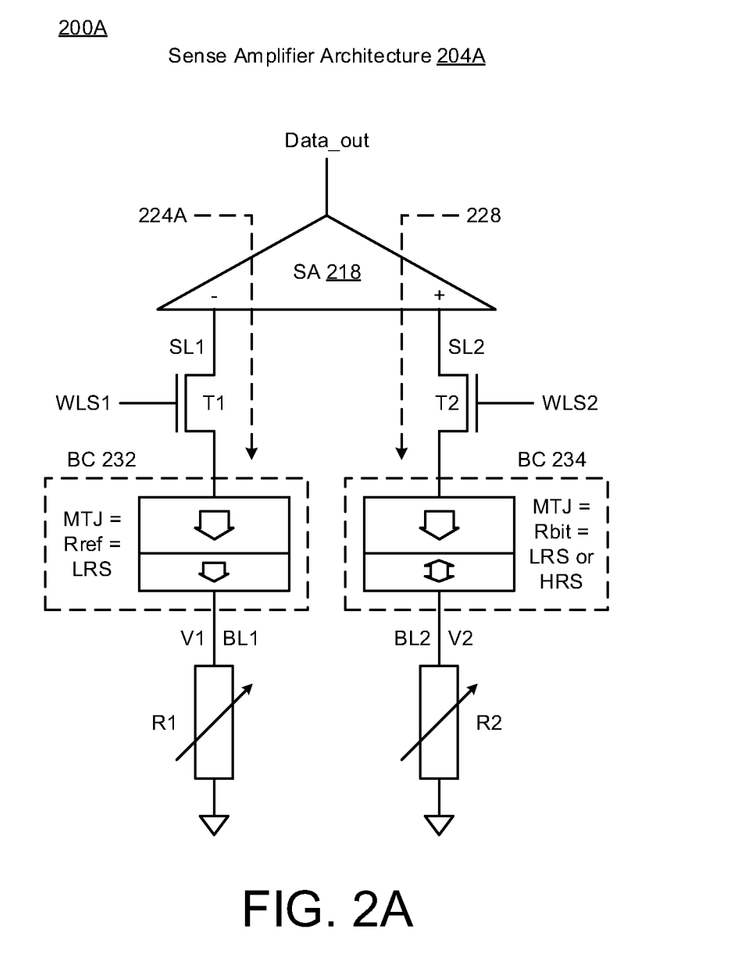
FIGS. 2A-2B illustrate diagrams of sense amplifier architecture in accordance with various implementations described herein.
Figure 2B:
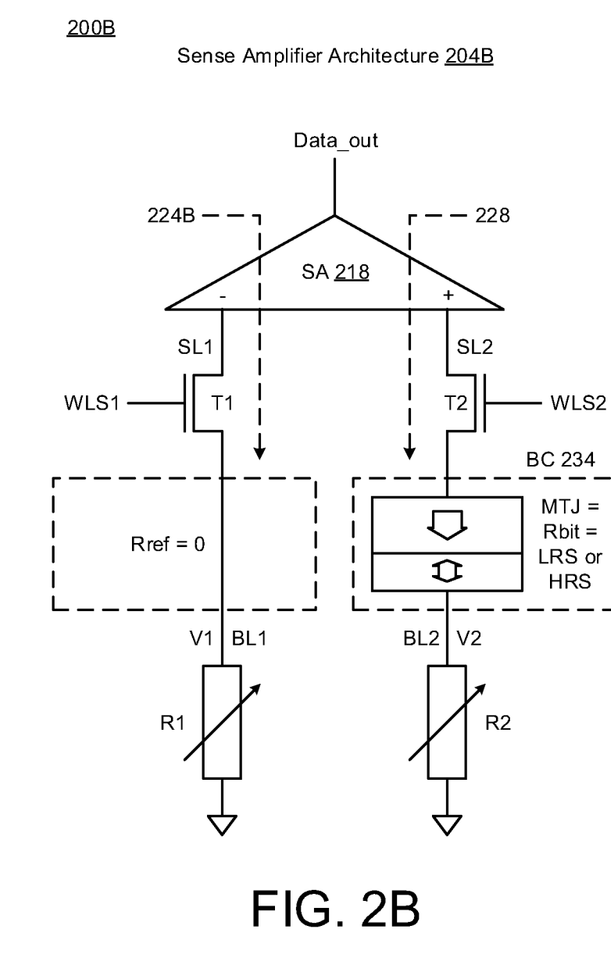

FIGS. 2A-2B illustrate diagrams of sense amplifier architecture in accordance with various implementations described herein. In particular, FIG. 2A shows a diagram 200A of sense amplifier architecture 204A, and also, FIG. 2B shows a diagram 200B of other sense amplifier architecture 204B.

In various implementations, the sense amplifier (SA) architectures 204A, 204B may be implemented as systems or devices having various integrated circuit components that are arranged and coupled together as an assemblage or some combination of parts that provide for physical circuit designs and various related structures. In some instances, a method of designing, providing, building and/or fabricating the SA architectures 204A, 204B as an integrated system or device may involve use of various IC circuit components described herein so as to implement various sensing schemes and techniques associated therewith. The SA architectures 204A, 204B may be integrated with computing circuitry and related components on a single chip, and also, the SA architectures 204A, 204B may be implemented in various embedded systems for automotive, electronic, mobile, server and Internet-of-things (IoT) applications, including remote sensor nodes.

As shown in FIG. 2A, the sense amplifier (SA) architecture 204A may include a sense amplifier (SA) 218 that is configured to provide output data (Data_out) based on sensing a difference between input signals (SL1, SL2). In various implementations, the sense amplifier (SA) 218 may refer to an operational amplifier (OpAmp) that is configured to operate as a differential sensing amplifier that senses the difference between the input signals (SL1, SL2) and then provides the output data (Data_out) as a data output signal based on sensing the difference between the input signals (SL1, SL2).

The sense amplifier (SA) architecture 204A may include a tracking circuit 224A that is configured to track a resistive state of a bitcell (BC) 234 and provide an input signal (SL1) to the sense amplifier (SA) 218 based on the tracked resistive state of the bitcell (BC) 234. The input signal (SL1) refers to a first input signal, and also, the tracking circuit 224A may provide the first input signal (SL1) to an inverting input (−) of the sense amplifier (SA) 218 based on the tracked resistive state of the bitcell (BC) 234. The tracking circuit 224A may have a first resistive bitcell (MTJ-BC) 232 coupled in series with a first resistor (R1) to the inverting input (−) of the sense amplifier (SA) 218. Also, the first resistive bitcell (MTJ-BC) 232 refers to a first magneto-resistive bitcell having a constant resistive state set to a low resistive value (LRS), wherein the first magneto-resistive bitcell operates as a reference resistor (Rref). The tracking circuit 224A may include a first access passgate (T1) coupled in series between the first resistive bitcell (MTJ-BC) 232 and the inverting input (−) of the sense amplifier (SA) 218, and the first access passgate (T1) may pass the first input signal (SL1) to the inverting input (−) of the sense amplifier (SA) 218, e.g., when activated with a first wordline selection signal (WLS1). Also, in some instances, the first access passgate (T1) may refer to an N-type transistor. However, various other transistor configurations may be used to achieve similar results.

In some implementations, the first resistor (R1) refers to a first variable resistor coupled between the first resistive bitcell (MTJ-BC) 232 and ground (VSS). As shown in FIG. 2A, the first resistive bitcell (MTJ-BC) 232 may be configured with aligned magnetic components so as to provide the MTJ as a reference resistor (Rref) having a low resistive state (LRS), wherein MTJ=Rref=LRS. Also, the first resistive bitcell (MTJ-BC) 232 may provide a first voltage (V1) to the first variable resistor (R1) via a first reference bitline (BL1). Also, this configuration of the tracking circuit 224A is used to provide the first input signal (SL1) to the inverting input (−) of the sense amplifier (SA) 218. Moreover, in various implementations, the first variable resistor (R1) may refer to a polysilicon variable resistor, a diffusion variable resistor, or some other similar variable resistor.

The sense amplifier (SA) architecture 204A may include a bitcell circuit 228 that is configured to sense a data value associated with the resistive state of the bitcell (BC) 234 and provide another input signal (SL2) to the sense amplifier (SA) 218 based on the sensed data value of the bitcell (BC) 234. The other input signal (SL2) refers to a second input signal, and also, the bitcell circuit 228 may provide the second input signal (SL2) to a non-inverting input (+) of the sense amplifier (SA) 218 based on the sensed data value of the bitcell (BC) 234. The bitcell circuit 228 has the bitcell (BC) 234 as a second resistive bitcell (MTJ-BC) 234 coupled in series with a second resistor (R2) to the non-inverting input (+) of the sense amplifier (SA) 218. In some instances, the second resistive bitcell (MTJ-BC) 234 refers to a second magneto-resistive bitcell having a selectively adjustable (or selectively programmable) resistive state set to a low resistive value (LRS) or a high resistive value (HRS). Also, the bitcell circuit 228 may have a second access passgate (T2) coupled in series between the second resistive bitcell (MTJ-BC) 234 and the non-inverting input (+) of the sense amplifier (SA) 218, and the second access passgate (T2) may pass the second input signal (SL2) to the non-inverting input (+) of the sense amplifier (SA) 218, e.g., when activated with a second wordline selection signal (WLS2). In some instances, the second access passgate (T2) may refer to an N-type transistor. However, various other transistor configurations may be used to achieve similar results.

In some implementations, the second resistor (R2) refers to a second variable resistor coupled between the programmable second resistive bitcell (MTJ-BC) 234 and ground (VSS). As shown in FIG. 2A, the second resistive bitcell (MTJ-BC) 234 may be configured with selectively programmable magnetic components so as to provide the MTJ with a low resistive state (LRS) or a high resistive state (HRS), wherein MTJ=Rbit=LRS or HRS. Also, the second resistive bitcell (MTJ-BC) 234 may provide a second voltage (V2) to the second variable resistor (R2) via a second reference bitline (BL2). Moreover, this configuration of the bitcell circuit 228 may be used to provide the second input signal (SL2) to the non-inverting input (+) of the sense amplifier (SA) 218. Also, in various implementations, the second variable resistor (R2) may refer to a polysilicon variable resistor, a diffusion variable resistor, or some other similar variable resistor.

As shown in FIG. 2B, the sense amplifier (SA) architecture 204B may include the sense amplifier (SA) 218, which is configured to provide output data (Data_out) based on sensing the difference between the input signals (SL1, SL2). In some implementations, the SA architecture 204B in FIG. 2B is similar in structure, function and scope to the SA architecture 204A in FIG. 2A, except for configuration of the tracking circuit 224B. For instance, the sense amplifier (SA) architecture 204B may include a reconfigured tracking circuit 224B along with a similar bitcell circuit 228. The tracking circuit 224B may include the first variable resistor (R1) that is coupled to the inverting input (−) of the sense amplifier (SA) 218 without the first resistive bitcell (MTJ-BC) 232, wherein Rref=0. Moreover, the bitcell circuit 228 may include the second resistive bitcell (MTJ-BC) 234 coupled in series with the second variable resistor (R2) to the non-inverting input (+) of the sense amplifier (SA) 218. The second resistive bitcell (MTJ-BC) 234 refers to a magneto-resistive bitcell having a programmable resistive state set to the low resistive value (LRS) or the high resistive value (HRS), wherein MTJ=Rbit=LRS or HRS.

Figure 3A:
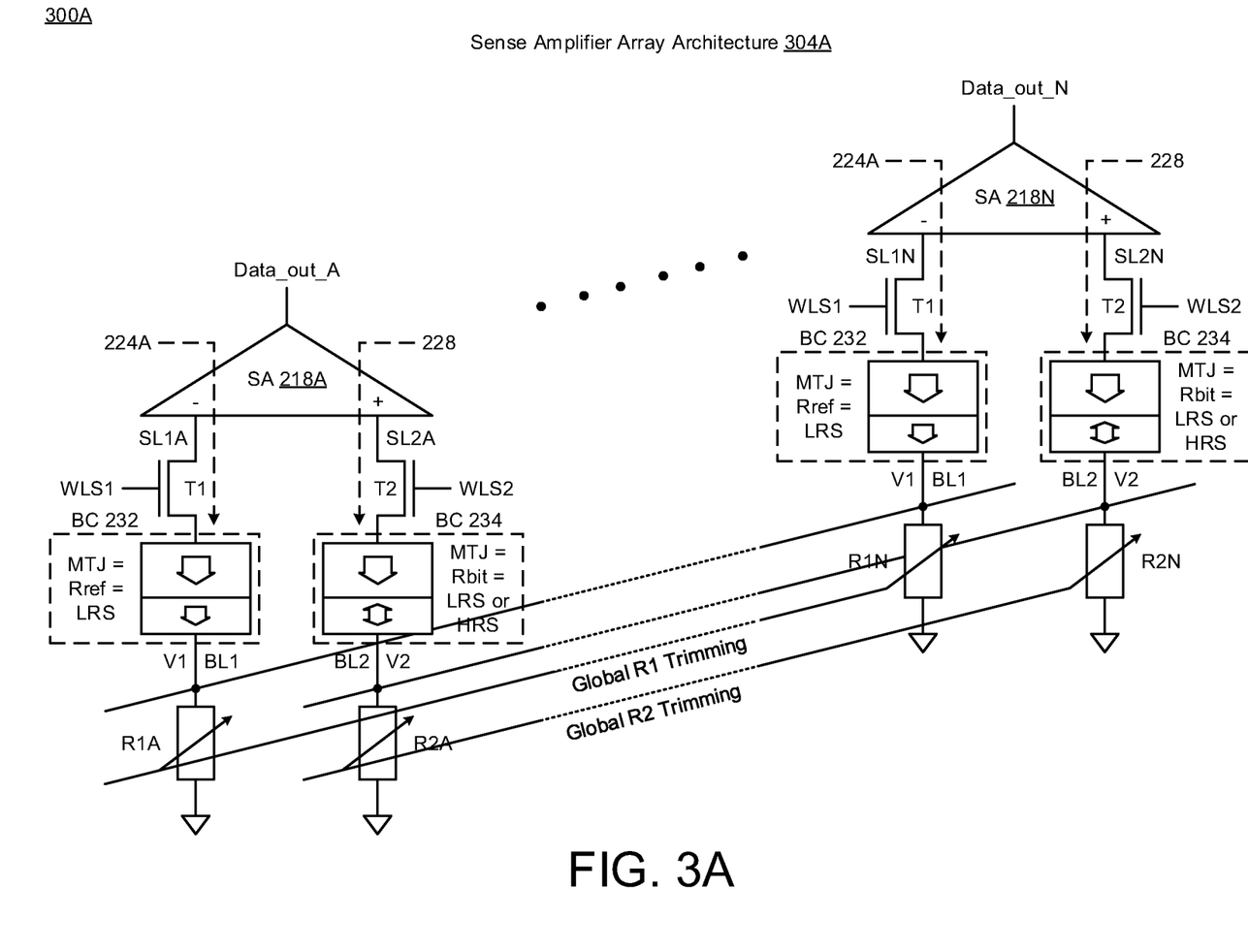
FIGS. 3A-3B illustrate various diagrams of sense amplifier array architecture in accordance with various implementations described herein.
Figure 3B:
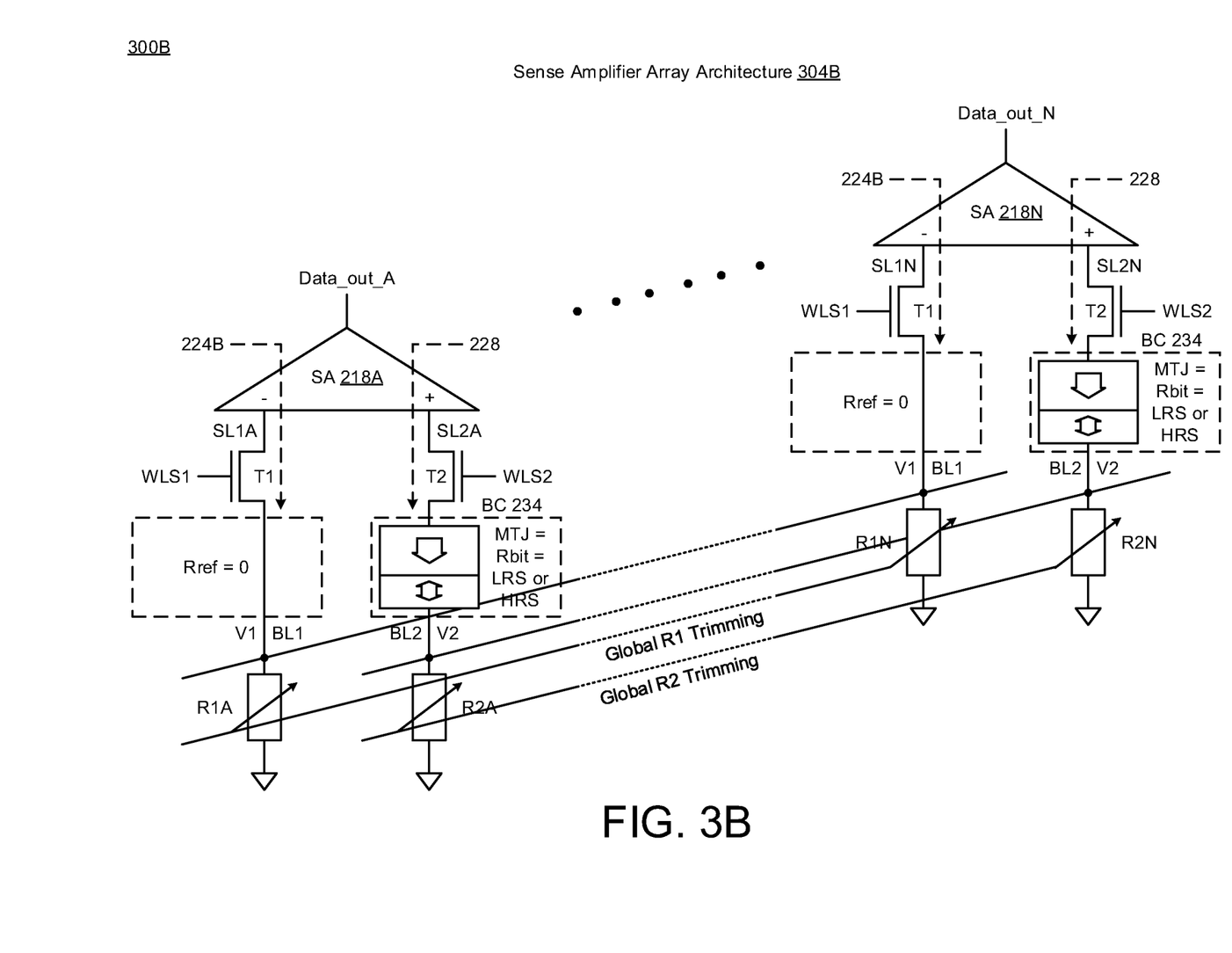

FIGS. 3A-3B illustrate various diagrams of sense amplifier array architecture in accordance with various implementations described herein. In particular, FIG. 3A shows a diagram 300A of sense amplifier array architecture 304A with global resistor trimming capability, and also, FIG. 3B shows a diagram 300B of other sense amplifier array architecture 304B with global resistor trimming capability.

In various implementations, the sense amplifier array architectures 304A, 304B may be implemented as systems or devices having various integrated circuit components that are arranged and coupled together as an assemblage or some combination of parts that provide for physical circuit designs and various related structures. In some instances, a method of designing, providing, building and/or fabricating SA array architectures 304A, 304B as an integrated system or device may involve use of various IC components described herein so as to implement various sensing schemes and techniques associated therewith. Also, the SA array architectures 304A, 304B may be integrated with computing circuitry and various related components on a single chip, and the SA array architectures 304A, 304B may also be implemented in embedded systems for automotive, electronic, mobile, server and IoT applications, including remote sensor nodes.

As shown in FIG. 3A, the sense amplifier (SA) array architecture 304A may include sense amplifier circuitry having an array of sense amplifiers (SA) 218A-218N that provides multi-bit output data (Data_out_A to Data_out_N) based on sensing a difference between multiple input signals (SL1A/SL2A to SL1N/SL2N). Each sense amplifier (SA) 218A-218N in the array of sense amplifiers may include tracking circuitry 224A and bitcell circuitry 228. The tracking circuitry 224A may be configured to track a resistive state of a memory cell (BC) 234 and provide a first input signal (SL1A-SL1N) of the multiple input signals (SL1A/SL2A to SL1N/SL2N) to each sense amplifier (SA) 218A-218N based on the tracked resistive state of the memory cell (BC) 234. The bitcell circuitry 228 may be configured to sense a data value associated with the resistive state of the memory cell (BC) 234 and then provide a second input signal (SL2A-SL2N) of the multiple input signals (SL1A/SL2A to SL1N/SL2N) to each sense amplifier (SA) 218A-218N, e.g., based on the sensed data value of the memory cell (BC) 234. In various instances, the bitcell circuitry 228 may be referred to as memory circuitry, and also, the memory cell (BC) 234 may be referred to as a bitcell (BC). In some implementations, each of the sense amplifiers (SA) 218A-218N in the SA array architecture 304A in FIG. 3A is similar in structure, function and scope to the SA architecture 204A in FIG. 2A, except for the global resistor trimming capability of the interconnected variable resistors (R1A/R2A to R1N/R2N).

In reference to global R1 trimming, the first variable resistors (R1A to R1N) may be coupled together, wherein the first variable resistor (R1A-R1N) for each sense amplifier (SA) 218A-218N may be coupled together with the other first variable resistors (R1A-R1N) of each other sense amplifier (SA) 218A-218N. In some implementations, the first resistor (R1A-R1N) for each sense amplifier (SA) 218A-218N refers to a first variable resistor that is globally trimmable together (for global R1 trimming) with the other first variable resistors (R1A-R1N) of each other sense amplifier (SA) 218A-218N.

In reference to global R2 trimming, the second variable resistors (R2A to R2N) may be coupled together, wherein the second variable resistor (R2A-R2N) for each sense amplifier (SA) 218A-218N are coupled together with the other second variable resistors (R2A-R2N) of each other sense amplifier (SA) 218A-218N. In some implementations, the second resistor (R2A-R2N) for each sense amplifier (SA) 218A-218N refers to a second variable resistor that is globally trimmable together (for global R2 trimming) with the other second variable resistors (R2A-R2N) of each other sense amplifier (SA) 218A-218N.

In various implementations, as shown in FIG. 3A, the SA array architecture 304A may be configured to blend the R1/R2 trimming resistors (R1A/R2A to R1N/R2N) and the sense amplifiers (SA) 218A-218N into a signal circuit so as to thereby share the R1/R2 trimming resistors (R1A/R2A to R1N/R2N) among one or more or all of the sense amplifiers (SA) 218A-218N. As such, the global R1/R2 trimming may be used to combine the reference resistors and the sense amplifiers for resistive memory applications.

As shown in FIG. 3B, the sense amplifier (SA) array architecture 304B may include the array of sense amplifiers (SA) 218A-218N, which is configured to provide the output data (Data_out_A to Data_out_N) based on sensing the difference between input signals (SL1A/SL2A to SL1N/SL2N). In some implementations, the SA array architecture 304B in FIG. 3B is similar in structure, function and scope to the SA array architecture 304A in FIG. 3A, except for configuration of the tracking circuit 224B. For instance, the SA array architecture 304B may include a reconfigured tracking circuit 224B along with a similar bitcell circuit 228. Also, in some implementations, each of the sense amplifiers (SA) 218A-218N in the SA array architecture 304B in FIG. 3B is similar in structure, function and scope to the SA architecture 204B in FIG. 2B, except for the global resistor trimming capability of the interconnected variable resistors (R1A/R2A to R1N/R2N).

In reference to global R1 trimming, the first variable resistors (R1A to R1N) may be coupled together, wherein the first variable resistor (R1A-R1N) for each sense amplifier (SA) 218A-218N may be coupled together with the other first variable resistors (R1A-R1N) of each other sense amplifier (SA) 218A-218N. In some implementations, the first resistor (R1A-R1N) for each sense amplifier (SA) 218A-218N refers to a first variable resistor that is globally trimmable together (for global R1 trimming) with the other first variable resistors (R1A-R1N) of each other sense amplifier (SA) 218A-218N.

In reference to global R2 trimming, the second variable resistors (R2A to R2N) may be coupled together, wherein the second variable resistor (R2A-R2N) for each sense amplifier (SA) 218A-218N are coupled together with the other second variable resistors (R2A-R2N) of each other sense amplifier (SA) 218A-218N. In some implementations, the second resistor (R2A-R2N) for each sense amplifier (SA) 218A-218N refers to a second variable resistor that is globally trimmable together (for global R2 trimming) with the other second variable resistors (R2A-R2N) of each other sense amplifier (SA) 218A-218N.

In various implementations, as shown in FIG. 3B, the SA array architecture 304B may be configured to blend the R1/R2 trimming resistors (R1A/R2A to R1N/R2N) and the sense amplifiers (SA) 218A-218N into a signal circuit so as to thereby share the R1/R2 trimming resistors (R1A/R2A to R1N/R2N) among one or more or all of the sense amplifiers (SA) 218A-218N. As such, the global R1/R2 trimming may be used to combine the reference resistors and the sense amplifiers for resistive memory applications.

Figure 4:
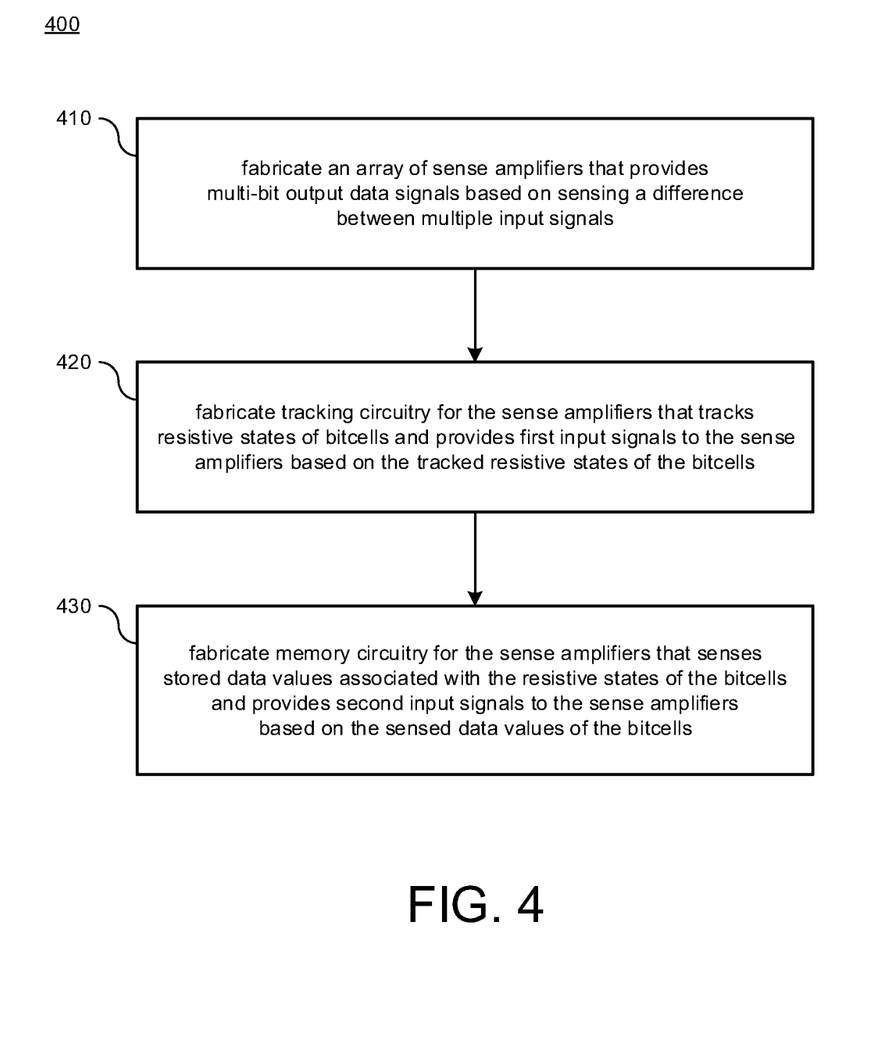
FIG. 4 illustrates a diagram of a method for providing memory architecture in accordance with various implementations described herein.

FIG. 4 illustrates a process diagram of a method 400 for providing memory architecture in accordance with various implementations described herein.

It should be understood that even though the method 400 indicates a particular order of operation execution, in some cases, various particular portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various components and/or circuitry, as described herein in reference to FIGS. 1-3B. Also, if implemented in software, the method 400 may be implemented as a program and/or software instruction process configured for providing sensing schemes and techniques, as described herein. Further, if implemented in software, various instructions associated with implementing method 400 may be stored in memory and/or a database. For instance, various types of computing devices having a processor and memory may be configured to perform method 400.

In various implementations, method 400 may refer to a method of designing, providing, building, fabricating and/or manufacturing an integrated circuit (IC) device that may involve the various sensing schemes and techniques described herein using various components and materials described herein. Also, the integrated circuit (IC) device may be integrated in various computing circuitry and related components on a single chip, and further, the integrated circuit (IC) device may be implemented in embedded systems for various electronic, mobile and/or Internet-of-things (IoT) applications.

At block 410, method 400 may be used to fabricate an array of sense amplifiers that provides multi-bit output data signals based on sensing a difference between multiple input signals. At block 420, method 400 may be used to fabricate tracking circuitry for the sense amplifiers that tracks resistive states of bitcells and provides first input signals to the sense amplifiers based on the tracked resistive states of the bitcells. Moreover, at block 430, method 400 may be used to fabricate memory circuitry for the sense amplifiers that senses stored (or recorded, or saved) data values associated with the resistive states of the bitcells and then provides second input signals to the sense amplifiers based on the sensed data values of the bitcells.

In various implementations, the tracking circuitry for the sense amplifiers may also include first variable resistors that are globally trimmable together with the other first variable resistors of each other sense amplifier in the array of sense amplifiers. Moreover, the memory circuitry for the sense amplifiers may also include second variable resistors that are globally trimmable together with the other second variable resistors of each other sense amplifier in the array of sense amplifiers. Also, in some instances, the bitcells refer to magneto-resistive bitcells having a selectively programmable resistive state set to a low resistive value (e.g., a logic 0) or a high resistive value (e.g., a logic 1).

In various implementations, the first variable resistor of each sense amplifier is coupled together with the other first variable resistors of each other sense amplifier, and the first variable resistor of each sense amplifier are globally trimmable together with the other first variable resistors of each other sense amplifier. Moreover, the second variable resistor of each sense amplifier is coupled together with the other second resistors of each other sense amplifier, and the second variable resistor of each sense amplifier is globally trimmable together with the other second variable resistors of each other sense amplifier.

Advantageously, the various schemes and techniques described herein above may provide for no DC bias to elaborate Rtrim (e.g., complete passive solution) that may assist with saving power. In various instances, reference signal settling time is improved, wherein Rtrim=R1−R2 is local to each sense amplifier when compared to being centrally elaborated and distributed across all input-output (IO) circuitry. Also, there is no need for an analog buffer and/or a capacitive decoupling, which results in area savings.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Also, it should be appreciated that such a development effort may be complex and time consuming, but would nevertheless be a routine undertaking of design, fabrication, and manufacture for those of ordinary skill having benefit of this disclosure.

Described herein are implementations of a device. The device may include a sense amplifier that provides output data based on sensing a difference between input signals. The device may include a tracking circuit that tracks a resistive state of a bitcell and provides an input signal to the sense amplifier based on the tracked resistive state of the bitcell. The device may include a bitcell circuit that senses a data value associated with the resistive state of the bitcell and provides another input signal to the sense amplifier based on the sensed data value of the bitcell.

Described herein are implementations of a device. The device may have sense amplifier circuitry with an array of sense amplifiers that provides multi-bit output data based on sensing a difference between multiple input signals. Each sense amplifier in the array of sense amplifiers may include tracking circuitry that tracks a resistive state of a memory cell and provides a first input signal of the multiple input signals to each sense amplifier based on the tracked resistive state of the memory cell. Each sense amplifier in the array of sense amplifiers may include memory circuitry that senses a data value associated with the resistive state of the memory cell and provides a second input signal of the multiple input signals to each sense amplifier based on the sensed data value of the memory cell.

Described herein are various implementations of a method. The method may fabricate an array of sense amplifiers that provides multi-bit output data signals based on sensing a difference between multiple input signals. The method may fabricate tracking circuitry for the sense amplifiers that tracks resistive states of bitcells and provides first input signals to the sense amplifiers based on the tracked resistive states of the bitcells. The method may fabricate memory circuitry for the sense amplifiers that senses stored data values associated with the resistive states of the bitcells and provides second input signals to the sense amplifiers based on the sensed data values of the bitcells.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
a sense amplifier that provides output data based on sensing a difference between input signals;
a tracking circuit that tracks a resistive state of a bitcell and provides an input signal to the sense amplifier based on the tracked resistive state of the bitcell, the tracking circuit having a first resistive bitcell coupled in series with a first resistor to an inverting input of the sense amplifier; and
a bitcell circuit that senses a data value associated with the resistive state of the bitcell and provides another input signal to the sense amplifier based on the sensed data value of the bitcell, the bitcell circuit having the bitcell as a second resistive bitcell coupled in series with a second resistor to a non-inverting input of the sense amplifier.

2. The device of claim 1, wherein:
the input signals refer to a first input signal and a second input signal,
the tracking circuit provides the first input signal to an inverting input of the sense amplifier based on the tracked resistive state of the bitcell, and
the bitcell circuit provides the second input signal to a non-inverting input of the sense amplifier based on the sensed data value of the bitcell.

3. The device of claim 2, wherein:
the tracking circuit has a first variable resistor coupled to the inverting input of the sense amplifier, and
the bitcell circuit has the bitcell coupled in series with a second variable resistor to the non-inverting input of the sense amplifier.

4. The device of claim 3, wherein:
the bitcell refers to a magneto-resistive bitcell having a programmable resistive state set to a low resistive value or a high resistive value.

5. The device of claim 1, wherein:
the first resistive bitcell refers to a first magneto-resistive bitcell having a constant resistive state set to a low resistive value, and
the second resistive bitcell refers to a second magneto-resistive bitcell having a programmable resistive state set to a low resistive value or a high resistive value.

6. The device of claim 1, wherein the first resistor refers to a first variable resistor, and wherein the second resistor refers to a second variable resistor.

7. The device of claim 1, wherein:
the tracking circuit has a first access passgate coupled in series between the first resistive bitcell and the inverting input of the sense amplifier, and
the first access passgate passes the first input signal to the inverting input of the sense amplifier when activated with a first wordline selection signal.

8. The device of claim 1, wherein:
the bitcell circuit has a second access passgate coupled in series between the second resistive bitcell and the non-inverting input of the sense amplifier, and
the second access passgate passes the second input signal to the non-inverting input of the sense amplifier when activated with a second wordline selection signal.

9. The device of claim 1, wherein the sense amplifier refers to an operational amplifier that operates as a differential sensing amplifier that is configured to sense the difference between the input signals and provide the output data as a data output signal based on sensing the difference between the input signals.

10. A device comprising:
sense amplifier circuitry having an array of sense amplifiers that provides multi-bit output data based on sensing a difference between multiple input signals,
wherein each sense amplifier in the array of sense amplifiers includes:
tracking circuitry that tracks a resistive state of a memory cell and provides a first input signal of the multiple input signals to each sense amplifier based on the tracked resistive state of the memory cell, the tracking circuitry for each sense amplifier having a first resistive bitcell coupled in series with a first resistor to an inverting input of each sense amplifier; and
memory circuitry that senses a data value associated with the resistive state of the memory cell and provides a second input signal of the multiple input signals to each sense amplifier based on the sensed data value of the memory cell, the memory circuitry for each sense amplifier having the memory cell as a second resistive bitcell coupled in series with a second resistor to a non-inverting input of each sense amplifier.

11. The device of claim 10, wherein:
the first resistive bitcell for each sense amplifier refers to a first magneto-resistive bitcell having a constant resistive state set to a low resistive value, and
the second resistive bitcell for each sense amplifier refers to a second magneto-resistive bitcell having a programmable resistive state set to a low resistive value or a high resistive value.

12. The device of claim 10, wherein:
the first resistor for each sense amplifier is coupled together with the other first resistors of each other sense amplifier,
the first resistor for each sense amplifier refers to a first variable resistor that is globally trimmable together with the other first variable resistors of each other sense amplifier,
the second resistor for each sense amplifier is coupled together with the other second resistors of each other sense amplifier, and
the second resistor for each sense amplifier refers to a second variable resistor that is globally trimmable together with the other second variable resistors of each other sense amplifier.

13. The device of claim 10, wherein:
the tracking circuitry for each sense amplifier has a first access passgate coupled in series between the first resistive bitcell and the inverting input of each sense amplifier,
the first access passgate passes the first input signal to the inverting input of each sense amplifier when activated with a first wordline selection signal,
the bitcell circuitry for each sense amplifier has a second access passgate coupled in series between the second resistive bitcell and the non-inverting input of each sense amplifier, and
the second access passgate passes the second input signal to the non-inverting input of each sense amplifier when activated with a second wordline selection signal.

14. The device of claim 10, wherein:

the tracking circuitry for each sense amplifier has a first variable resistor coupled to an inverting input of each sense amplifier, the bitcell circuitry for each sense amplifier has the bitcell coupled in series with a second variable resistor to the non-inverting input of the sense amplifier, and the bitcell refers to a magneto-resistive bitcell having a programmable resistive state set to a low resistive value or a high resistive value.

15. The device of claim 14, wherein:

the first variable resistor for each sense amplifier is globally trimmable together with the other first variable resistors of each other sense amplifier, and the second variable resistor for each sense amplifier is globally trimmable together with the other second variable resistors of each other sense amplifier.

16. A method comprising:

fabricating an array of sense amplifiers that provides multi-bit output data signals based on sensing a difference between multiple input signals;

fabricating tracking circuitry for the sense amplifiers that tracks resistive states of bitcells and provides first input signals to the sense amplifiers based on the tracked resistive states of the bitcells, the tracking circuitry for each sense amplifier having a first resistive bitcell coupled in series with a first resistor to an inverting input of each sense amplifier; and fabricating memory circuitry for the sense amplifiers that senses stored data values associated with the resistive states of the bitcells and provides second input signals to the sense amplifiers based on the sensed data values of the bitcells, the memory circuitry for each sense amplifier having the memory cell as a second resistive bitcell coupled in series with a second resistor to a non-inverting input of each sense amplifier.

17. The method of claim 16, wherein:

the tracking circuitry for the sense amplifiers includes the first resistors as first variable resistors that are globally trimmable together with the other first variable resistors of each other sense amplifier in the array of sense amplifiers, and the memory circuitry for the sense amplifiers includes the second resistors as second variable resistors that are globally trimmable together with the other second variable resistors of each other sense amplifier in the array of sense amplifiers.

18. The method of claim 16, wherein:

the bitcells refer to magneto-resistive bitcells having a selectively programmable resistive state set to a low resistive value or a high resistive value.

* * * * *